United States Patent
Huang et al.

(10) Patent No.: US 9,105,757 B2
(45) Date of Patent: Aug. 11, 2015

(54) JUNCTION BARRIER SCHOTTKY DIODE AND MANUFACTURING METHOD THEREOF

(71) Applicants: Chih-Fang Huang, Hsinchu (TW); Tsung-Yi Huang, Hsinchu (TW); Chien-Wei Chiu, Yunlin (TW); Tsung-Yu Yang, Kaohsiung (TW); Ting-Fu Chang, Taipei (TW); Tsung-Chieh Hsiao, Changhua (TW); Ya-Hsien Liu, Hsinchu (TW); Po-Chin Peng, Zhubei (TW)

(72) Inventors: Chih-Fang Huang, Hsinchu (TW); Tsung-Yi Huang, Hsinchu (TW); Chien-Wei Chiu, Yunlin (TW); Tsung-Yu Yang, Kaohsiung (TW); Ting-Fu Chang, Taipei (TW); Tsung-Chieh Hsiao, Changhua (TW); Ya-Hsien Liu, Hsinchu (TW); Po-Chin Peng, Zhubei (TW)

(73) Assignee: Richtek Technology Corporation, R.O.C., Chupei, HsinChu (TW)

( * ) Notice: Subject to any disclaimer, the term of this patent is extended or adjusted under 35 U.S.C. 154(b) by 35 days.

(21) Appl. No.: 14/040,670

(22) Filed: Sep. 28, 2013

(65) Prior Publication Data
US 2015/0021615 A1    Jan. 22, 2015

(30) Foreign Application Priority Data
Jul. 18, 2013  (TW) .............................. 102125659 A

(51) Int. Cl.
*H01L 29/872* (2006.01)
*H01L 29/66* (2006.01)
*H01L 29/868* (2006.01)
*H01L 29/06* (2006.01)
*H01L 29/20* (2006.01)
*H01L 29/205* (2006.01)

(52) U.S. Cl.
CPC .......... *H01L 29/872* (2013.01); *H01L 29/0619* (2013.01); *H01L 29/66212* (2013.01); *H01L 29/0657* (2013.01); *H01L 29/2003* (2013.01); *H01L 29/205* (2013.01)

(58) Field of Classification Search
CPC ............ H01L 29/872; H01L 29/66143; H01L 29/66212; H01L 29/868
See application file for complete search history.

(56) References Cited

U.S. PATENT DOCUMENTS

2011/0049526 A1    3/2011  Chu et al.
2013/0126884 A1 *  5/2013  Romano et al. ................. 257/76

* cited by examiner

*Primary Examiner* — Whitney T Moore
(74) *Attorney, Agent, or Firm* — Tung & Associates

(57) ABSTRACT

The present invention discloses a junction barrier Schottky (JBS) diode and a manufacturing method thereof. The JBS diode includes: an N-type gallium nitride (GaN) substrate; an aluminum gallium nitride (AlGaN) barrier layer, which is formed on the N-type GaN substrate; a P-type gallium nitride (GaN) layer, which is formed on or above the N-type GaN substrate; an anode conductive layer, which is formed at least partially on the AlGaN barrier layer, wherein a Schottky contact is formed between part of the anode conductive layer and the AlGaN barrier layer; and a cathode conductive layer, which is formed on the N-type GaN substrate, wherein an ohmic contact is formed between the cathode conductive layer and the N-type GaN substrate, and the cathode conductive layer is not directly connected to the anode conductive layer.

4 Claims, 6 Drawing Sheets

JUNCTION BARRIER SCHOTTKY DIODE AND MANUFACTURING METHOD THEREOF

CROSS REFERENCE

The present invention claims priority to TW 102125659, filed on Jul. 18, 2013.

BACKGROUND OF THE INVENTION

1. Field of Invention

The present invention relates to a junction barrier Schottky (JBS) diode and a manufacturing method thereof; particularly, it relates to such JBS diode which includes an N-type gallium nitride (GaN) substrate and manufacturing method thereof.

2. Description of Related Art

FIG. 1 shows a schematic diagram of a prior art junction barrier Schottky (JBS) diode 100 from cross-section view. As shown in FIG. 1, the JBS diode 100 includes an N-type silicon substrate 11, a first N-type epitaxial silicon layer 12, a second N-type epitaxial silicon layer 13, a P-type grid 14, an anode conductive layer 15, and a cathode conductive layer 16. The N-type impurity concentration of the N-type silicon substrate 11 is about 1E19 $cm^{-3}$. The N-type impurity concentration of the first N-type epitaxial silicon layer 12 is about 1E18 $cm^{-3}$. The N-type impurity concentration of the second N-type epitaxial silicon layer 13 is about 3.5E15 $cm^{-3}$.

The JBS diode combines a Schottky diode and a PIN diode, which are connected in parallel. The JBS diode is advantageous over a typical PIN diode in that its response time is relatively shorter and its conductive current is relatively higher, because the Schottky diode in the JBS diode has a relatively lower threshold voltage when the JBS diode is forward-biased. The JBS diode also has a relatively lower reverse leakage current, because depletion regions are formed by the P-type grid 14 and the second N-type epitaxial silicon layer 13 in the JBS diode to pinch off the reverse current path when the JBS diode is reverse-biased.

However, the aforementioned prior art JBS diode is inadequate when a further shorter response time, a further lower conductive resistance, and a more precise control of a breakdown voltage are required.

Therefore, to overcome the drawbacks in the prior art, the present invention proposes an JBS diode and manufacturing method thereof, so that the operation speed is increased, the conductive resistance is decreased, and the breakdown voltage is more precisely controlled.

SUMMARY OF THE INVENTION

From one perspective, the present invention provides a junction barrier Schottky (JBS) diode including: an N-type gallium nitride (GaN) substrate; an aluminum gallium nitride (AlGaN) barrier layer, which is formed on the N-type GaN substrate; a P-type gallium nitride (GaN) layer, which is formed on the AlGaN barrier layer or on the N-type GaN substrate; an anode conductive layer, which is formed at least partially on the AlGaN barrier layer, wherein a Schottky contact is formed between part of the anode conductive layer and the AlGaN barrier layer; and a cathode conductive layer, which is formed on the N-type GaN substrate, wherein an ohmic contact is formed between the cathode conductive layer and the N-type GaN substrate, and the cathode conductive layer is not directly connected to the anode conductive layer.

From another perspective, the present invention provides a manufacturing method of a junction barrier Schottky (JBS) diode including: providing an N-type gallium nitride (GaN) substrate with an upper surface; forming an aluminum gallium nitride (AlGaN) barrier layer on the N-type GaN substrate; forming a P-type gallium nitride (GaN) layer on or above the N-type GaN substrate; forming a cathode conductive layer on the N-type GaN substrate, wherein an ohmic contact is formed between the cathode conductive layer and the N-type GaN substrate; forming an anode conductive layer at least partially on the AlGaN barrier layer, wherein a Schottky contact is formed between part of the anode conductive layer and the AlGaN barrier layer, and the cathode conductive layer is not directly connected to the anode conductive layer.

In one preferable embodiment, the P-type GaN layer and the N-type GaN substrate are separated by the AlGaN barrier layer.

In the aforementioned embodiment, preferably, a Schottky diode is formed by the anode conductive layer, the AlGaN barrier layer, the N-type GaN substrate, and the cathode conductive layer; a PIN diode is formed by the P-type GaN layer, the AlGaN barrier layer, and the N-type GaN substrate; wherein the Schottky diode and the PIN diode are connected in parallel.

In another preferable embodiment wherein the P-type GaN layer is formed on the N-type GaN substrate, a Schottky diode is formed by the anode conductive layer, the AlGaN barrier layer, the N-type GaN substrate, and the cathode conductive layer; a PIN diode is formed by the P-type GaN layer and the N-type GaN substrate; wherein the Schottky diode and the PIN diode are connected in parallel.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
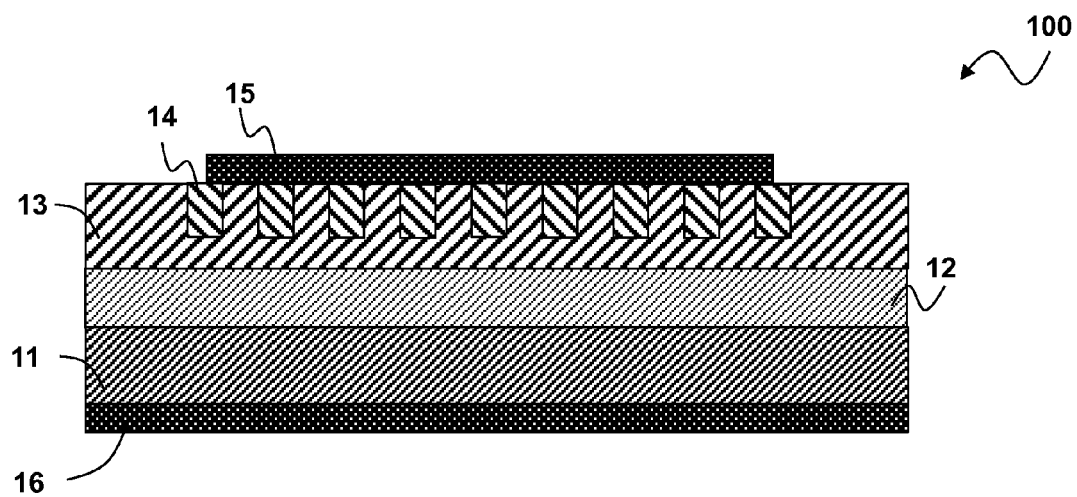
FIG. 1 shows a schematic diagram of a prior art junction barrier Schottky (JBS) diode 100 from cross-section view.
Figure 2A:
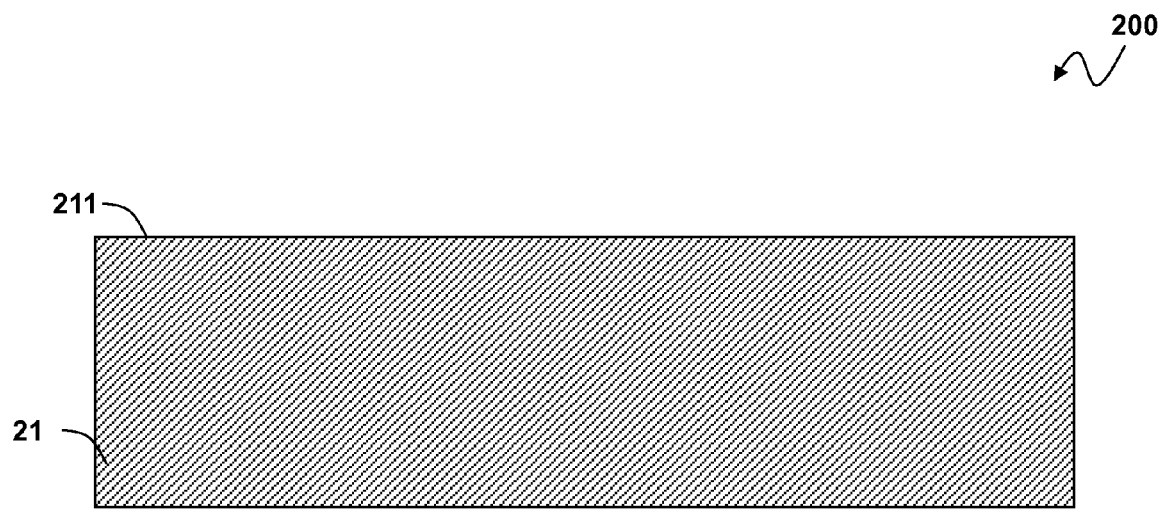
FIGS. 2A-2E show a first embodiment of the present invention.
Figure 2B:
Figure 2C:
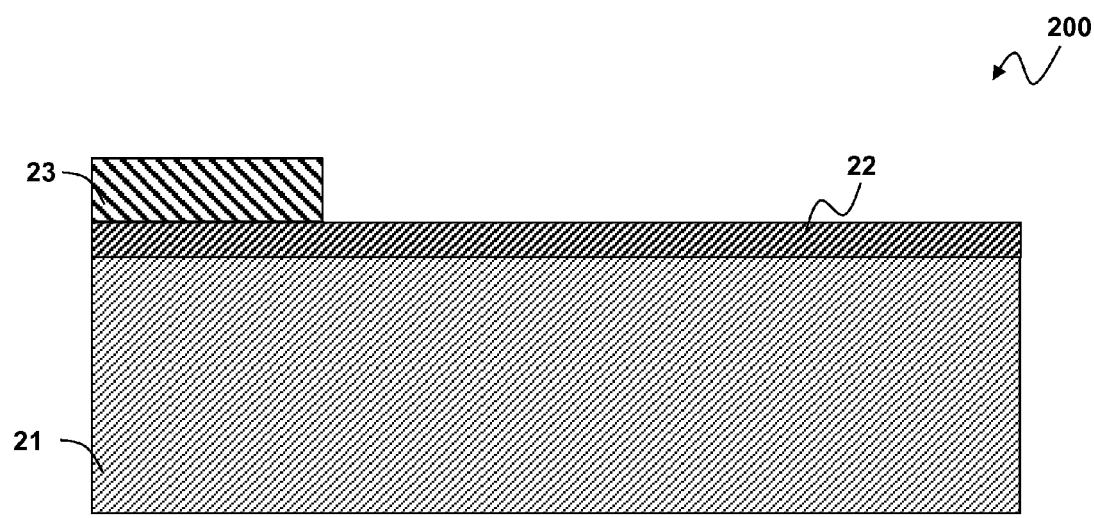
Figure 2D:
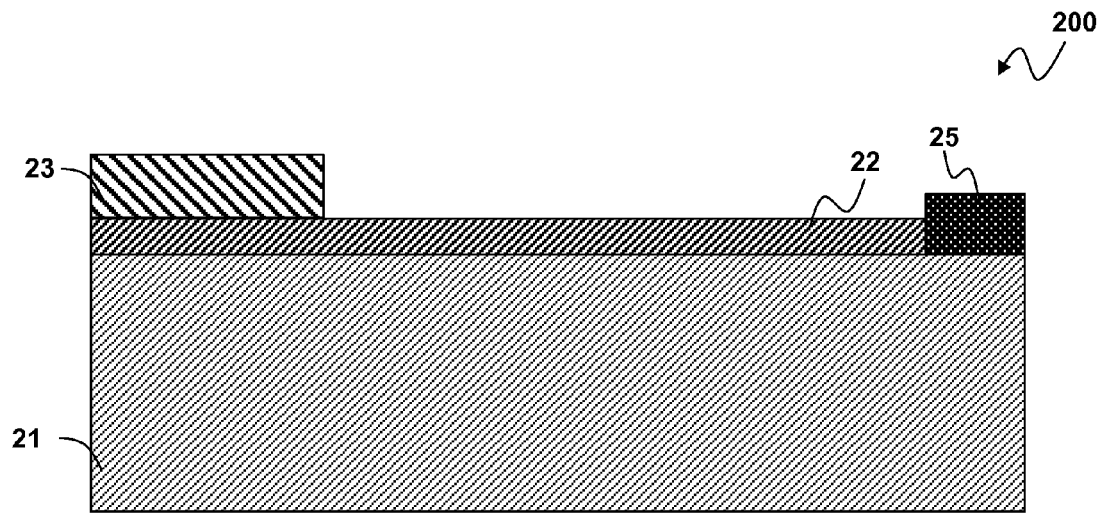
Figure 2E:
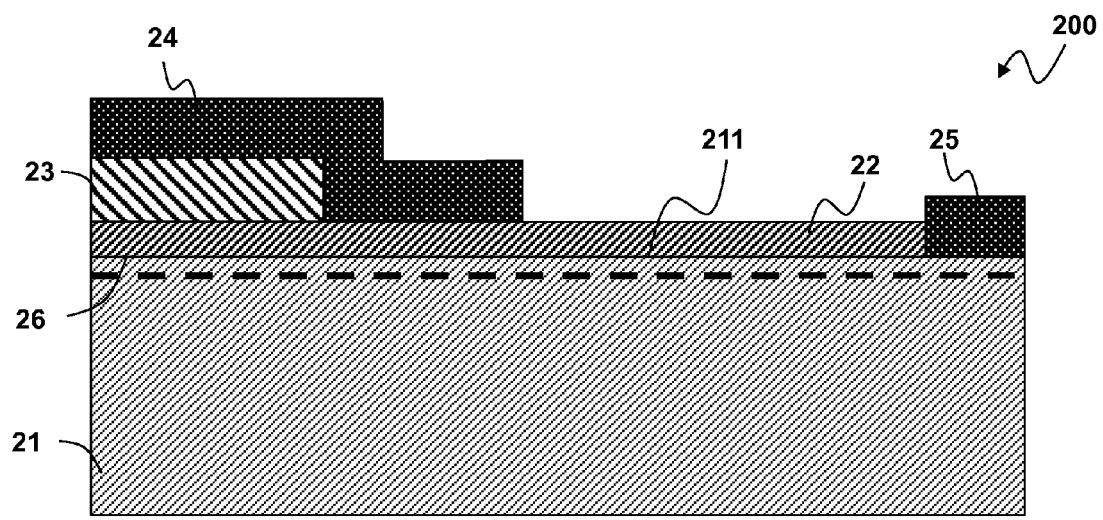

Please refer to FIGS. 2A-2E for a first embodiment according to the present invention, wherein FIGS. 2A-2E are schematic cross-section diagrams showing a manufacturing method of a junction barrier Schottky (JBS) diode 200. As shown in FIG. 2A, first, an N-type gallium nitride (GaN) substrate 21 with an upper surface 211 is provided. Next, an aluminum gallium nitride (AlGaN) barrier layer 22 is formed on the upper surface 211 as shown in FIG. 2B. Next, as shown in FIG. 2C, a P-type GaN layer 23 is formed above the N-type GaN substrate 21. Next, as shown in FIG. 2D, a cathode conductive layer 25 is formed on the upper surface 211, and an ohmic contact is formed between the cathode conductive layer 25 and the N-type GaN substrate 21. Next, as shown in FIG. 2E, an anode conductive layer 24 is formed on the AlGaN barrier layer 22, and a Schottky contact is formed between part of the anode conductive layer 24 and the AlGaN barrier layer 22. As shown in FIG. 2E, another part of the anode conductive layer 24 for example may overlay the P-type GaN layer 23, and the cathode conductive layer 25 is not connected to the anode conductive layer 24 directly.

The present invention is different from the prior art JBS diode at least in the following aspects. First, the JBS diode according to the present invention has a lateral structure, which is different from the vertical structure of the prior art JBS diode. In the lateral structure according to the present invention, the distance between the anode conductive layer and the cathode conductive layer of the JBS diode is determined by a lithography process step, which can very precisely the distance such that the breakdown voltage of the JBS diode can be more precisely controlled as compared with the prior art JBS diode. Second, different from the prior art JBS wherein the N-type silicon substrate is the cathode, the JBS diode according to the present invention includes the N-type GaN substrate and the AlGaN barrier layer, wherein a two-dimensional electron gas (2DEG) is formed between the N-type GaN substrate and the AlGaN barrier layer, whereby the operation speed is greatly improved such that the JBS diode according to the present invention can switch faster than the prior art JBS diode. Besides, the 2DEG can reduce the conductive resistance, so the characteristics and performance of the JBS diode under forward-biased condition is better. Besides, the JBS diode according to the present invention can sustain relatively higher surge current than the prior art JBS diode, so the reliability of the JBS diode according to the present invention is relatively higher. As shown in FIG. 2E, a Schottky diode is formed by the anode conductive layer 24, the AlGaN barrier layer 22, the N-type GaN substrate 21, and the cathode conductive layer 25; a PIN diode is formed by the P-type GaN layer 23, the AlGaN barrier layer 22, and the N-type GaN substrate 21; the Schottky diode and the PIN diode are connected in parallel. Besides, a 2DEG 26 is formed at and nearby a junction between the N-type GaN substrate 21 and the AlGaN barrier layer 22 (as indicated by a dash line shown in the figure).

Figure 3A:
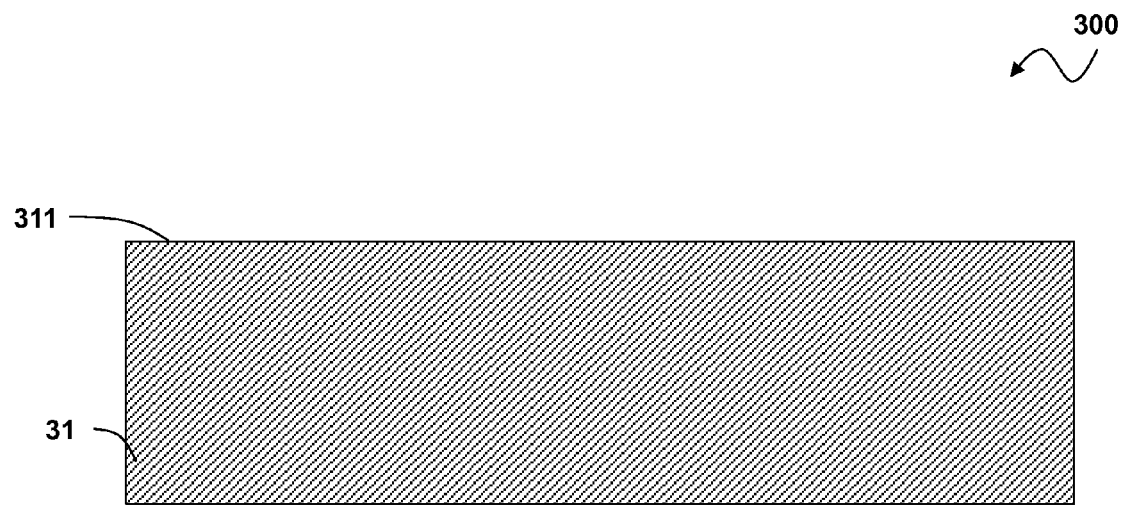
FIGS. 3A-3E show a second embodiment of the present invention.
Figure 3B:
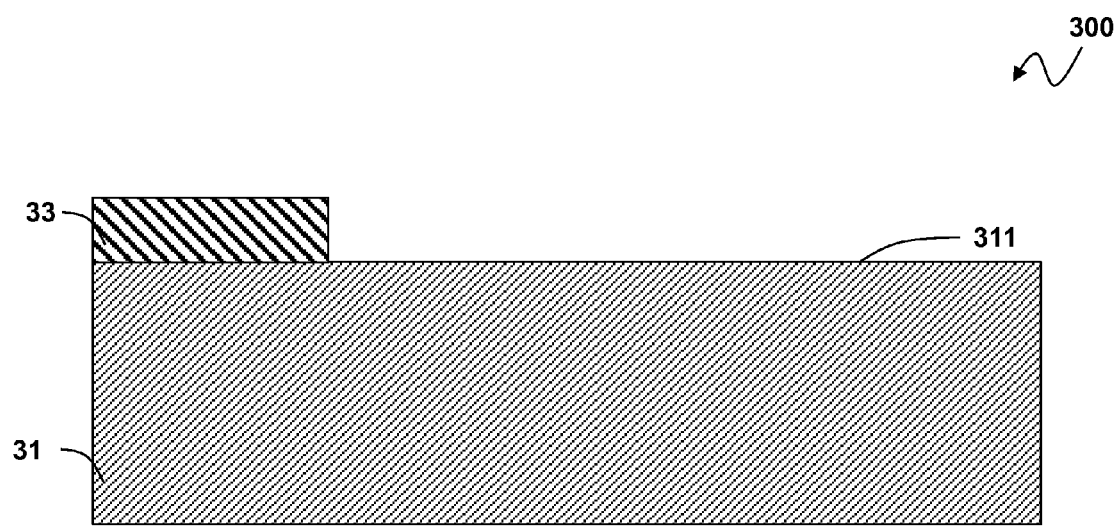
Figure 3C:
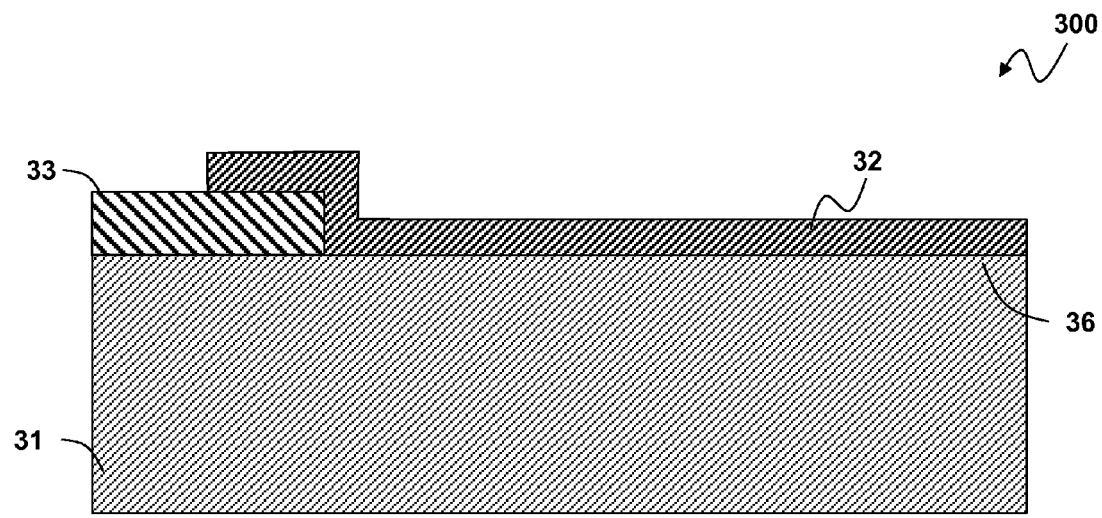
Figure 3D:
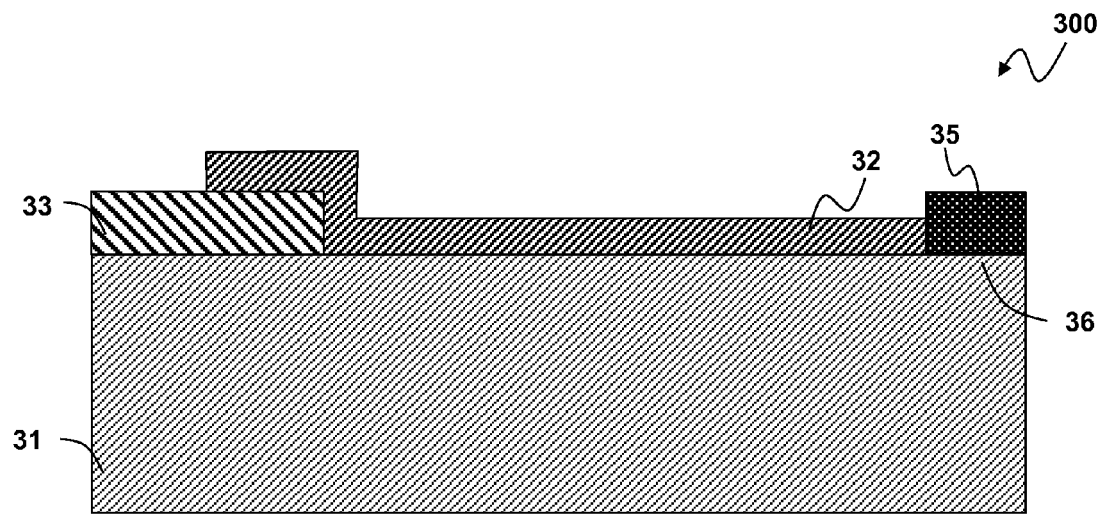
Figure 3E:
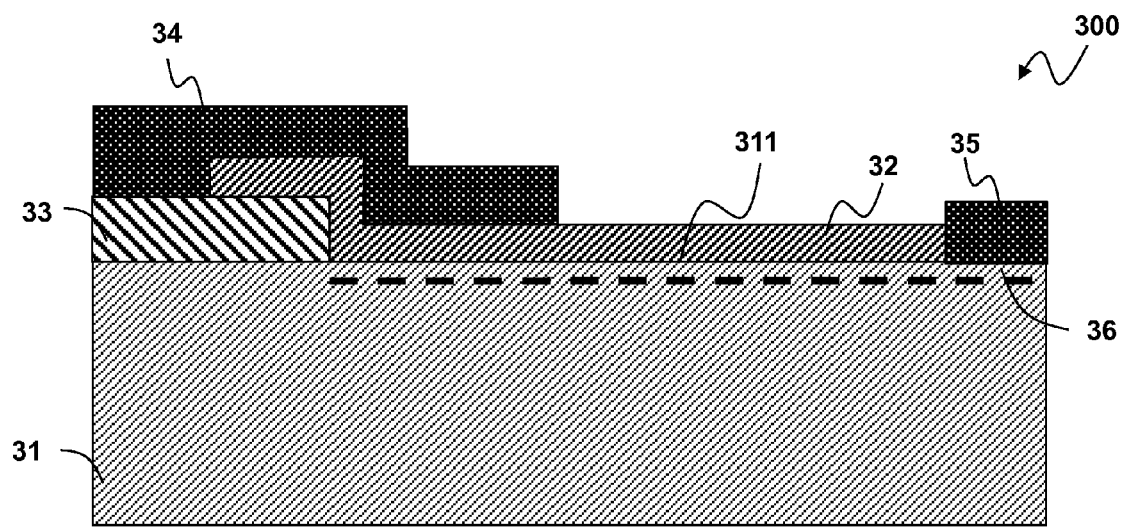

FIGS. 3A-3E show a second embodiment of the present invention. In the first embodiment shown in FIGS. 2A-2E, the P-type GaN layer and the N-type GaN substrate are separated by the AlGaN barrier layer; in this embodiment, the P-type GaN layer and the N-type GaN substrate are in direct contact as shown in FIGS. 3A-3E. FIGS. 3A-3E are schematic cross-section diagrams showing a manufacturing method of a junction barrier Schottky (JBS) diode 300. As shown in FIG. 3A, first, an N-type gallium nitride (GaN) substrate 31 with an upper surface 311 is provided. Next, as shown in FIG. 3B, a P-type GaN layer 33 is formed on the upper surface 311. Next, an AlGaN barrier layer 32 is formed on the N-type GaN substrate 31 as shown in FIG. 3C. Next, as shown in FIG. 3D, a cathode conductive layer 35 is formed on the upper surface 311, and an ohmic contact is formed between the cathode conductive layer 35 and the N-type GaN substrate 31. Next, as shown in FIG. 3E, an anode conductive layer 34 is formed on the AlGaN barrier layer 32, and a Schottky contact is formed between part of the anode conductive layer 34 and the AlGaN barrier layer 32. As shown in FIG. 3E, another part of the anode conductive layer 34 for example may overlay the P-type GaN layer 33, and the cathode conductive layer 35 is not connected to the anode conductive layer 34 directly.

As shown in FIG. 3E, a Schottky diode is formed by the anode conductive layer 34, the AlGaN barrier layer 32, the N-type GaN substrate 31, and the cathode conductive layer 35; a PIN diode is formed by the P-type GaN layer 33, the AlGaN barrier layer 32, and the N-type GaN substrate 31; the Schottky diode and the PIN diode are connected in parallel. Besides, a 2DEG 36 is formed at and nearby a junction between the N-type GaN substrate 31 and the AlGaN barrier layer 32 (as indicated by a dash line shown in the figure).

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the lithography step described in the above can be replaced by electron beam lithography, X-ray lithography, etc.; for another example, in all the aforementioned embodiments, an ohmic contact region may be defined and etched in the N-type GaN substrate before the cathode conductive layer is formed. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A junction barrier Schottky (JBS) diode comprising:
    an N-type gallium nitride (GaN) substrate;
    an aluminum gallium nitride (AlGaN) barrier layer, which is formed on the N-type GaN substrate;
    a P-type gallium nitride (GaN) layer, which is formed on the AlGaN barrier layer or on the N-type GaN substrate;
    an anode conductive layer, which is formed at least partially on the AlGaN barrier layer, wherein a Schottky contact is formed between part of the anode conductive layer and the AlGaN barrier layer; and
    a cathode conductive layer, which is formed on the N-type GaN substrate, wherein an ohmic contact is formed between the cathode conductive layer and the N-type GaN substrate, and the cathode conductive layer is not directly connected to the anode conductive layer;
    wherein the P-type GaN layer is formed on the AlGaN barrier layer, and the P-type GaN layer and the N-type GaN substrate are separated by the AlGaN barrier layer;
    wherein a Schottky diode is formed by the anode conductive layer, the AlGaN barrier layer, the N-type GaN substrate, and the cathode conductive layer; wherein a PIN diode is formed by the P-type GaN layer, the AlGaN barrier layer, and the N-type GaN substrate; wherein the Schottky diode and the PIN diode are connected in parallel.

2. A junction barrier Schottky (JBS) diode comprising:
    an N-type gallium nitride (GaN) substrate;
    an aluminum gallium nitride (AlGaN) barrier layer, which is formed on the N-type GaN substrate;
    a P-type gallium nitride (GaN) layer, which is formed on the AlGaN barrier layer or on the N-type GaN substrate;
    an anode conductive layer, which is formed at least partially on the AlGaN barrier layer, wherein a Schottky contact is formed between part of the anode conductive layer and the AlGaN barrier layer; and
    a cathode conductive layer, which is formed on the N-type GaN substrate, wherein an ohmic contact is formed between the cathode conductive layer and the N-type GaN substrate, and the cathode conductive layer is not directly connected to the anode conductive layer;
    wherein a Schottky diode is formed by the anode conductive layer, the AlGaN barrier layer, the N-type GaN substrate, and the cathode conductive layer; wherein the P-type GaN layer is formed on the N-type GaN substrate, and a PIN diode is formed by the P-type GaN layer and the N-type GaN substrate; wherein the Schottky diode and the PIN diode are connected in parallel.

3. A manufacturing method of a junction barrier Schottky (JBS) diode comprising:
- providing an N-type gallium nitride (GaN) substrate;
- forming an aluminum gallium nitride (AlGaN) barrier layer on the N-type GaN substrate;
- forming a P-type gallium nitride (GaN) layer on or above the N-type GaN substrate;
- forming a cathode conductive layer on the N-type GaN substrate, wherein an ohmic contact is formed between the cathode conductive layer and the N-type GaN substrate;
- forming an anode conductive layer at least partially on the AlGaN barrier layer, wherein a Schottky contact is formed between part of the anode conductive layer and the AlGaN barrier layer, and the cathode conductive layer is not directly connected to the anode conductive layer;
- wherein the P-type GaN layer and the N-type GaN substrate are separated by the AlGaN barrier layer; wherein the P-type GaN layer and the N-type GaN substrate are separated by the AlGaN barrier layer;
- wherein a Schottky diode is formed by the anode conductive layer, the AlGaN barrier layer, the N-type GaN substrate, and the cathode conductive layer; wherein a PIN diode is formed by the P-type GaN layer, the AlGaN barrier layer, and the N-type GaN substrate; wherein the Schottky diode and the PIN diode are connected in parallel.

4. A manufacturing method of a junction barrier Schottky (JBS) diode comprising:
- providing an N-type gallium nitride (GaN) substrate;
- forming an aluminum gallium nitride (AlGaN) barrier layer on the N-type GaN substrate;
- forming a P-type gallium nitride (GaN) layer on or above the N-type GaN substrate;
- forming a cathode conductive layer on the N-type GaN substrate, wherein an ohmic contact is formed between the cathode conductive layer and the N-type GaN substrate;
- forming an anode conductive layer at least partially on the AlGaN barrier layer, wherein a Schottky contact is formed between part of the anode conductive layer and the AlGaN barrier layer, and the cathode conductive layer is not directly connected to the anode conductive layer;
- wherein a Schottky diode is formed by the anode conductive layer, the AlGaN barrier layer, the N-type GaN substrate, and the cathode conductive layer; wherein the P-type GaN layer is formed on the N-type GaN substrate, and a PIN diode is formed by the P-type GaN layer and the N-type GaN substrate; wherein the Schottky diode and the PIN diode are connected in parallel.

* * * * *